(12) United States Patent
Yang et al.

(10) Patent No.: US 8,731,495 B2
(45) Date of Patent: May 20, 2014

(54) SYSTEM AND METHOD FOR DIGITAL MEMORIZED PREDISTORTION FOR WIRELESS COMMUNICATION

(75) Inventors: Dali Yang, Mountain View, CA (US); Jia Yang, Mountain View, CA (US)

(73) Assignee: Dali Systems Co. Ltd., George Town, Grand Cayman (KY)

( * ) Notice: Subject to any disclaimer, the term of this patent is extended or adjusted under 35 U.S.C. 154(b) by 0 days.

(21) Appl. No.: 13/619,538

(22) Filed: Sep. 14, 2012

(65) Prior Publication Data

US 2013/0243124 A1 Sep. 19, 2013

Related U.S. Application Data

(63) Continuation of application No. 11/262,079, filed on Oct. 27, 2005, now Pat. No. 8,326,238, which is a continuation of application No. 10/137,556, filed on May 1, 2002, now Pat. No. 6,985,704.

(51) Int. Cl.
 *H04B 1/04* (2006.01)

(52) U.S. Cl.
 USPC ............. 455/126; 455/114.2; 455/114.3; 330/149

(58) Field of Classification Search
 USPC ................................................ 455/126
 See application file for complete search history.

(56) References Cited

U.S. PATENT DOCUMENTS

| | | | | |
|---|---|---|---|---|
| 5,959,499 | A | * | 9/1999 | Khan et al. ............ 330/149 |
| 6,242,979 | B1 | * | 6/2001 | Li ........................ 330/149 |
| 7,248,642 | B1 | * | 7/2007 | Vella-Coleiro ........ 375/296 |

* cited by examiner

*Primary Examiner* — Ajibola Akinyemi
(74) *Attorney, Agent, or Firm* — Kilpatrick Townsend & Stockton LLP

(57) ABSTRACT

An embodiment of the invention is a system for signal processing in preparation for wireless transmission, the wireless transmission being from a portable wireless communication device and including use of a power amplifier having nonlinear characteristics. The system includes memory for storing digitally-indexed information. The digitally-indexed information models nonlinear characteristics of the power amplifier, and the digitally-indexed information is stored prior to processing of a first signal that reflects information to be communicated. The system further includes first logic, configured to accept the first signal and to retrieve, based on the first signal, a portion of the digitally-indexed information stored in the memory, and second logic, configured to generate a second signal based on the portion of the digitally-accessed information and on the first signal. The second signal pre-compensates for the nonlinear characteristics of the power amplifier, and the second signal is for wireless transmission based on the second signal.

14 Claims, 4 Drawing Sheets

SYSTEM AND METHOD FOR DIGITAL MEMORIZED PREDISTORTION FOR WIRELESS COMMUNICATION

CROSS REFERENCE TO RELATED APPLICATIONS

This application is a continuation of U.S. patent application Ser. No. 11/262,079, filed on Oct. 27, 2005, now U.S. Pat. No. 8,326,238, which is a continuation of U.S. patent application Ser. No. 10/137,556, filed on May 1, 2002, now U.S. Pat. No. 6,985,704. Each of these references is hereby incorporated by reference in its entirety for all purposes.

BACKGROUND OF THE INVENTION

The present invention relates to wireless communication. The present invention is especially applicable to mobile wireless communication and processing of signals to compensate for nonlinearities associated with power amplifiers used for wireless transmission.

Next-generation wireless communication will utilize improved transmitter technology for variety of broadband and multimedia services, supported by advanced potable equipment and handsets. For a long time, the longer handset battery life-time, better call quality and less wireless high-frequency radiation to human brain are three most concerning and insolvable issues for mobile phone designers and users. Actually, the above three problems are closely related to spectral efficiency and power efficiency of handset, because both higher spectral efficiency and power efficiency will greatly improve mobile system performance, extend handset battery life-time and reduce handset transmitted power to some extent. However, the nonlinear distortion and low DC conversion efficiency introduced by power amplifier (PA) in current handset RF transmitter impact severely performance of wireless system and shortens greatly battery life-time of handset.

Next-generation wireless communication will require improved transmitter technology for variety of broadband and multimedia applications, supported by advanced improved base stations and access points to potable equipment and handsets. The spectral efficiency and power efficiency are among the most important requirements of mobile communication systems. For many years, the designers of wireless communication system have been concerning the issue of PA linearization in RF transmitter, because it is closely related to the development of highly spectral efficiency modulation scheme. It has been demonstrated that the spectrally efficient linear modulation technologies such as QPSK and QAM have high spectral efficiency under the case of linear amplification. However, in order to obtain the highest power efficiency, the nonlinear power amplifier such as Class AB, C or D is required in final amplifying stage of RF transmitter. Unfortunately, the high power efficiency of nonlinear amplifiers generates nonlinear inter-modulation products in adjacent channels, which results in both amplitude to amplitude (AM-AM) and amplitude to phase (AM-PM) distortion. The nonlinear distortion will cause spectral broadening and high out-of-band power emission of output signal. As the result, the signal spectrum expands into adjacent channels to produce interference for other users. Furthermore, these inter-modulation distortion products are spaced so close to the desired signal and cannot simply be filtered out by conventional filters. In order to avoid the nonlinear distortion, a simple and usual solution is to back off output signal from the saturation range of PA so that signal level is confined to the power amplifier. However, this will result in a less power efficient operation because several decibels of back off are required usually to obtain appropriate linearity. Obviously, the approach is not suitable to the advanced wireless system design that should be a high capacity and efficient digital transmission system.

For a long time, the longer handset battery's life-time, less radio radiation to human brain and high voice quality have been the most concerning problems by handset designers, makers and users. Actually, the key to solve above problems is closely related to develop the handset RF system with spectral efficiency and power efficiency. The higher spectral efficiency and power efficiency not only improve greatly mobile system performance, but also extend battery life-time of handset and reduce transmitter's radiation which will be helpful to protect users' brain from radiation to some extent.

Current predistortion technologies used widely to linearize PA in mobile communication system are mainly analog predistorter implemented at IF/RF by means of analog circuit and digital predistorter at baseband with digital signal processing (DSP) technique.

The analog predistorter is based on the principle of error subtraction and power match to realize linearization of PA, and, hence must use an auxiliary PA to match the main PA. Under a perfect matching, the error of auxiliary PA will compensate nonlinear distortion caused by main PA. Because nonlinear feature of PA is very complicated and many variables are involved, the analog predistortion has only less predistortion accuracy and consumes more power.

In contrast, the DSP-based predistorter is usually preferred since it has stable characteristics that perform in a wide range of temperatures, and eliminates the necessary of tuning in factory. Therefore, it is better suitable to the fast tracking and adjusting any possible changes in PA parameters, such as drifts due to temperature, aging and operating point variations.

Unfortunately, although DSP-based predistortion technologies have advantages over analog ones, it is difficult for current digital predistortion schemes to apply to handset and wideband system because of complexity in hardware organization 25 and DSP algorithm.

SUMMARY OF THE INVENTION

In order to avoid interference and enhance performance of handset, RF power amplifier of handset should have a near-linear conversion characteristic. The linearization characteristics can be obtained, for example, by systems and methods for predistortion according to embodiments of the present invention.

According to one embodiment of the present invention, there is a system for signal processing in preparation for wireless transmission, the wireless transmission being from a portable wireless communication device, wherein the wireless transmission includes use of a power amplifier having nonlinear characteristics. The system comprises: memory for storing digitally-indexed information, wherein the digitally-indexed information models nonlinear characteristics of the power amplifier, and the digitally-indexed information is stored prior to processing of a first signal that reflects information to be communicated; first logic, configured to accept the first signal and to retrieve, based on the first signal, a portion of the digitally-indexed information stored in the memory; second logic, configured to generate a second signal based on the portion of the digitally-accessed information and on the first signal, wherein the second signal pre-compensates for the nonlinear characteristics of the power amplifier, and the second signal is for wireless transmission based on the second signal.

According to another embodiment of the present invention, there is a portable electronic device having wireless communication capabilities. The portable electronic device comprises: a processor for executing commands that direct operations of the portable electronic device; a wireless transmission stage that includes a power amplifier having nonlinear characteristics; memory for storing digitally-indexed data, including digitally-indexed information that reflects nonlinear characteristics of the power amplifier; and code stored in the memory that directs the processor to: determine, given a first signal that includes information to be communicated wirelessly, a correction contribution based on the signal and on the digitally-indexed information that reflects nonlinear characteristics of the power amplifier; and pre-compensate for the nonlinear characteristics of the power amplifier, based on the correction contribution, to obtain a second signal, wherein the wireless transmission stage will transmit wirelessly based on the second signal.

According to another embodiment of the present invention, there is, in a portable mobile device, a method for processing signals in preparation for wireless transmission, wherein the wireless transmission includes use of a power amplifier. The method comprises: maintaining a lookup table that contains pre-computed distortion contributions, the distortion contributions being for distorting of signals to thereby pre-compensate the signals for nonlinear characteristics of the power amplifier; accepting a value that reflects information to be communicated, the value hereinafter referred to as original value; generating a lookup-table key based on the original value, wherein the lookup-table key is digital; retrieving from the lookup table, using the lookup-table key, a pre-computed distortion contribution for the original value; distorting the original value based on the pre-computed distortion contribution to obtain a distorted value to pre-compensate for the nonlinear characteristics of the power amplifier; and wirelessly transmitting based on the distorted value.

These and other embodiments of the present invention are further made apparent, in the remainder of the present document, to those of ordinary skill in the art.

BRIEF DESCRIPTION OF THE DRAWINGS

In order to more fully describe embodiments of the present invention, reference is made to the accompanying drawings. These drawings are not to be considered limitations in the scope of the invention, but are merely illustrative.

DETAILED DESCRIPTION OF SPECIFIC EMBODIMENTS

Figure 1:
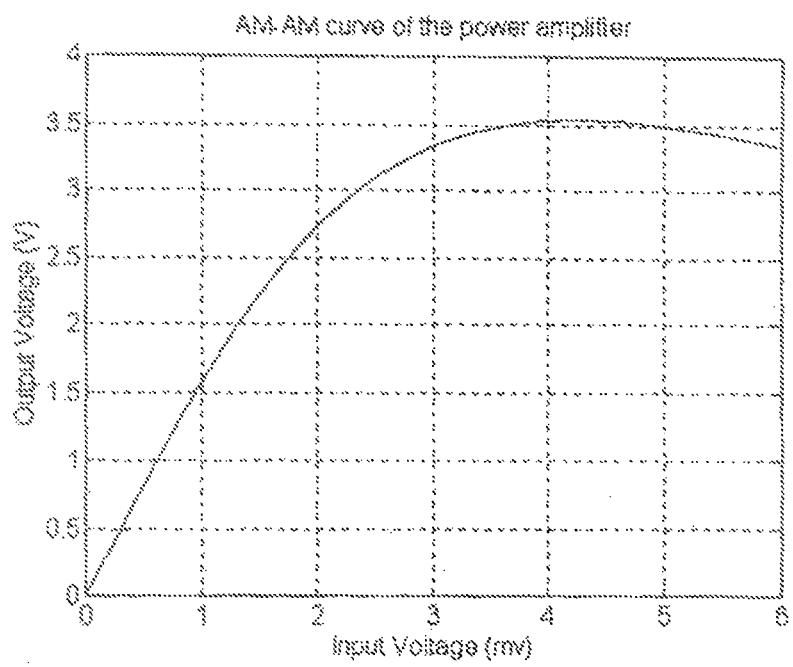
FIGS. 1 and 2 show typical AM-AM and AM-PM behaviors of PA to be predistorted.

The description above and below and the drawings of the present document focus on one or more currently preferred embodiments of the present invention and also describe some exemplary optional features and/or alternative embodiments.

The description and drawings are for the purpose of illustration and not limitation. Those of ordinary skill in the art would recognize variations, modifications, and alternatives. Such variations, modifications, and alternatives are also within the scope of the present invention. Section titles are terse and are for convenience only.

Preferred embodiments of the present invention relate to a novel digital adaptive predistorter to linearize power amplifier (PA) in RF transmitter of mobile stations, including variety of mobile potable equipment, handsets and PDA, for CDMA, TDMA, 20 GSM, GPRS, 3G (UMTS, W-CDMA, CDMA2000, 3GPP and others), WLAN system that transmits the complex modulated signal with aid of quadrature modulator and power amplifier. Because power amplifier in RF transmitter distorts RF output signal, the digital predistorter is used to correct non-linearity of PA by predistortion in opposite sense to PA input. The preferred circuit arrangement in embodiments of the present invention is specially designed for all wireless mobile stations or handsets, and also can be used in base stations or access points and other wireless communication systems such as microwave and satellite communications. Preferred embodiments of the present invention present a practicable DSP-based predistortion algorithm and organization using to handset without increasing manufacture cost but improving greatly handset performance.

In accordance with the preferred embodiment architecture, a presented digital adaptive predistorter is designed to linearize wireless RF transmitter for all handsets system, such as for CDMA, TDMA, GSM, 3G and WLAN system, and the like. For the application of predistortion technology in handset, the following issues are especially of interest:
1. Dynamic predistortion control range to track and correct non-linearity of PA in wider range;
2. Fast convergence speed to swiftly track characteristics of PA;
3. Requirement for low power consumption to extend handset battery life-time, which needs time-saving software algorithm and less complicity hardware structure;
4. Being able to use the existing source and chip room in handset for manufacture cost consideration.

Based on above considerations, a new design of adaptive memorized predistorter 15 for wireless handsets, according to an embodiment of the present invention has the following properties:
1. Using a stored compensation principle's structure to make the predistorter be able to memory great amount non-linear characteristics of PA for much better predistortion performance in wider dynamic range;
2. Using a time-delay adaptive structure to improve non-linearity tracking;
3. Using a simple architecture in implementation to use the existing DSP room in handsets without additional hardware circuit for low power consumption and low manufacture cost. 25

Figure 3:
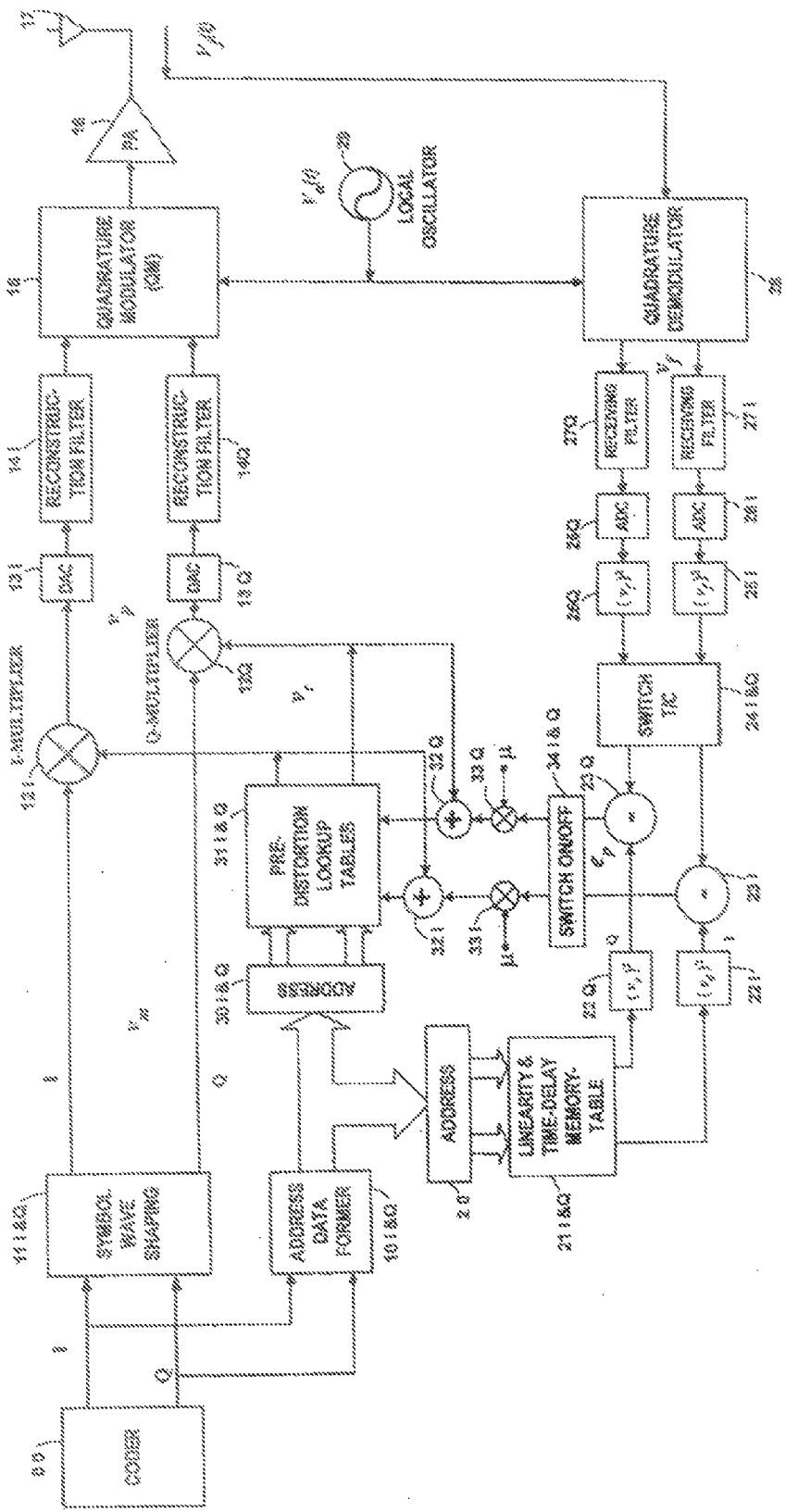
FIG. 3 shows a training schematic diagram of digital adaptive predistorter to linearize power amplifier in handset, which is an embodiment of the present invention.

The components of embodiment architecture shown in FIG. 3 are described as follows:
00: Coder to generate the required modulation data under wireless system specifications
10 I-Q: Address data formers to obtain the required address data
11 I-Q: Base band symbol wave shaping filters
12 I-Q: N-bit vector multipliers to result the predistorted signals for I-Q channel respectively
13 I-Q: Digit to analog converters
14 I-Q: Analog reconstruction filters
15: Quadrature modulator 16: Nonlinear power amplifier
17: Antenna
20 I-Q: Address registers
21 I-Q: Memory tables to store linearity of PA and time-delay characteristics of channels
22 I-Q: Square circuits to generate the envelope of reference signals $v_d$
23 I-Q: Envelope comparator to generate the error signals $e_p$
24 I-Q: Switch T/C: T is in the training status when system is trained and C is in the calling status when system finishes training
25 I-Q: Square circuits of feedback channels to generate the envelope of feedback signals $v_f$
26 I-Q: Analog to digit converters
27 I-Q: Analog receiving filters
28: Demodulator
29 Local oscillator to generate a high frequency carrier signal
30 I-Q: Address registers of lookup tables
31 I-Q: Predistortion lookup tables to store nonlinear characteristic of PA
32 I-Q: Adders of lookup tables
33 I-Q: Step size factors of adaptive algorithm
34 I-Q: Switch On/Off: On is when system is trained, and Off is when the training finished Power Amplifier (PA) Model Prior to further describing the predistorter according to embodiments the present patent, the characteristic of PA is discussed initially.

Power amplifier is the final stage of handset RF transmitter, and normally consumes the most electrical power. For the high efficient linear modulations such as QPSK or QAM, a linear high power amplifier must be used to maintain optimum spectral efficiency and low out-of-band emission. Such a linear amplifier, however, does not usually have a good DC to RF power conversion efficiency. For instance, traditional class-A power amplifier has a maximum theoretical power conversion efficiency of 50%. This is a major drawback for mobile application, especially for the portable battery operated equipment such as handsets, where battery life is of major importance. The power conversion efficiency can be obtained by using nonlinear power amplifier, such as class AB, C or D power amplifier. However, these amplifiers distort the input-output signal and cause spectral broadening and high out-of-band power emission of the output signal.

Figure 2:
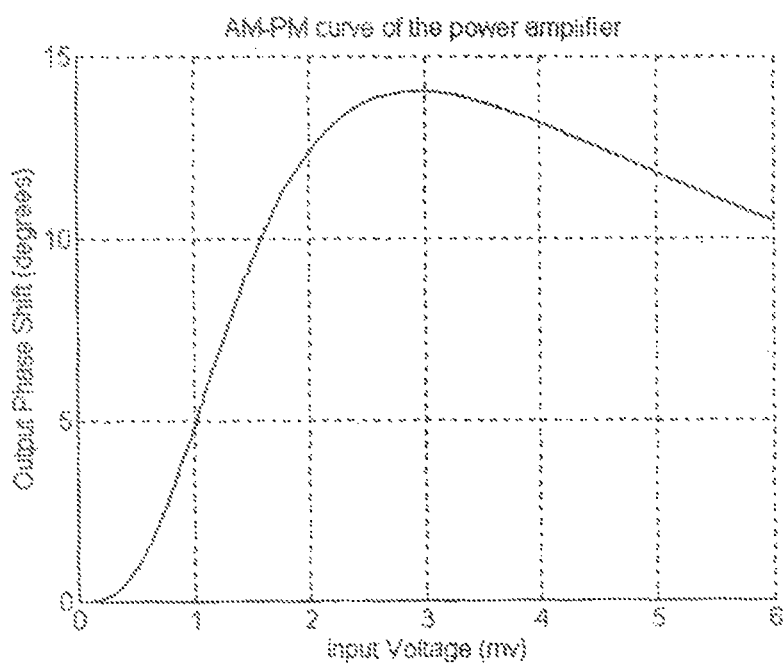

The PA in mobile communication system should typically be operated close to saturation or even saturated so as to maximize power efficiency. The saturation has serious repercussions on the signal to be amplified, and exhibits nonlinear characteristics such as amplitude and phase distortion that lead to an undesirable inter-modulation interference in the neighboring frequency band. The amplitude and phase characteristics used in this patent are shown in FIGS. 1 and 2, respectively.

Adaptive Predistorter

FIG. 3 shows the organization of handset digital predistorter from base band through RF part. The predistorter consists of address data formers 10I-10Q, linearity and time-delay lookup tables 21I-21Q, predistortion lookup tables 31I-31Q, vector multipliers 12I-12Q, error comparators 23I-23Q, and two types of switches 24I-24Q and 34I-34Q. All signals in the architecture are denoted by v(t) with the corresponding subscripts to express their location in system.

In accordance with a preferred implementation of the presented invention, the coded I/Q data symbols to be transmitted are fed into both digital base band waveshaping filters 11I-11Q and address data former 10I-10Q, respectively.

The address data formers 10I-10Q are designed to generate the required binary signal format. The data formers 10I-10Q receive signal from coder 00 first, and then transform the received signal to the sign symbol with form either 0 or 1. The binary data are used as the address of both predistortion lookup tables 31I-31Q and linearity and time-delay lookup tables 21I-21Q.

The linearity and time-delay tables 31I-31Q are used to store the linearity characteristics of PA 16 and time-delay parameters of channels. The signal time-delay of channel is caused when I- and Q-signal from the output of shaping filters 11I-11Q pass through the circuit components, such as multiplier 12I-12Q, DAC 13I-13Q, reconstruction filters 14I-14Q, QM 15, PA 16, DQM 28, receiver filters 27I-27Q, ADCs 26I-26Q, squire circuits 25I-25Q and switchers 24I-24Q to the comparers 23I-23Q. The 20 stored signals in the tables 21I-21Q are first obtained by adaptive iteration, and then are used as linear reference model to compare feedback signal that contains nonlinear distortion component. The lookup tables 21I-21Q are updated by adaptive algorithm in training period. When the training period is over, the required linear and time-delay information are stored in the tables for predistortion tables' training. As the result, there is no necessary to build a special time-delay circuit for channel time-delay estimate of handset.

The predistorter lookup tables 30I-30Q are used to store the predistortion signal to linearize power amplifier. The required predistorted signals in the tables are obtained by adaptive training and by comparing the outputs of tables 21I-21Q and feedback signals. The outputs $v_r(k)$ of lookup table 30I-30Q are fed to multipliers 12I-12Q, and multiply with signals $v_m(k)$ from shaping filters 11I-11Q to result a predistorted signal $v_p(k)$ that is an inverse non-linearity of PA to predistort the input of PA.

The switch ON/OFF controllers 34I-34Q are set to ON status when predistortion lookup tables 31I-31Q are trained by adaptive algorithm. After the training procedure completed, the switches are set to Off status and the predistortion lookup tables 34I-34Q are no longer updated adaptively.

The switch T/C controllers 24I-24Q are used to choose handset circuit status. When the lookup tables are trained, the switches are set to Training status so that two types of lookup tables 21I-21Q and 31I-31Q are updated by adaptive algorithm. When the training processing is completed, the controllers are switched to the calling status and all lookup tables in handset stop being updated.

Figure 4:
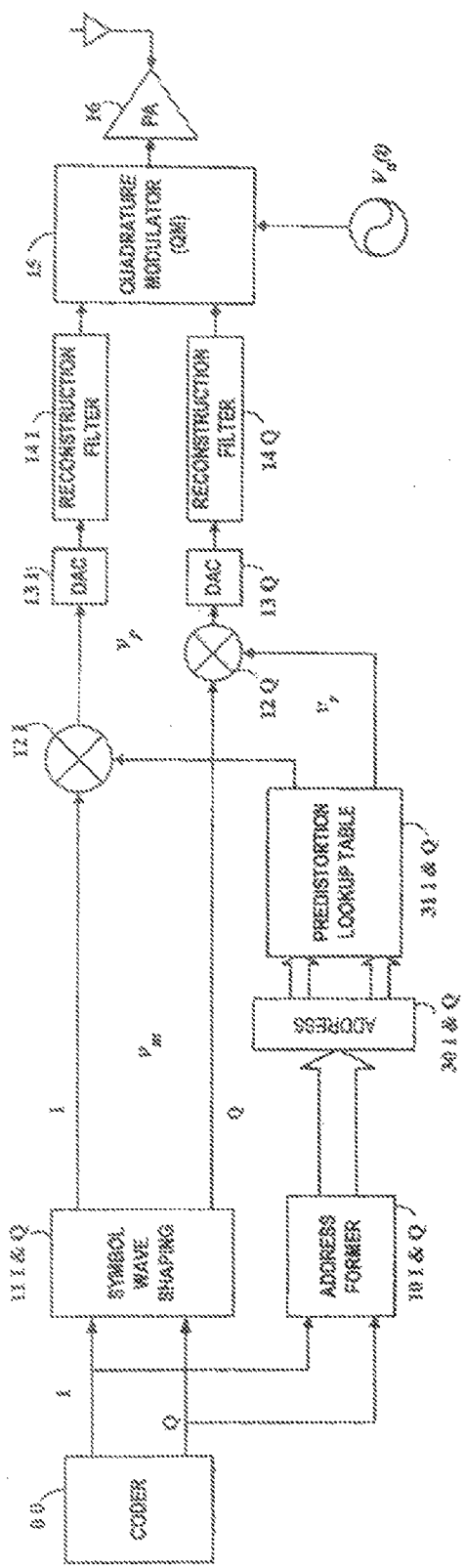
FIG. 4 shows schematically a structure of adaptive predistorter in handset when the training finished, which is an embodiment of the present invention.
Figure 5:
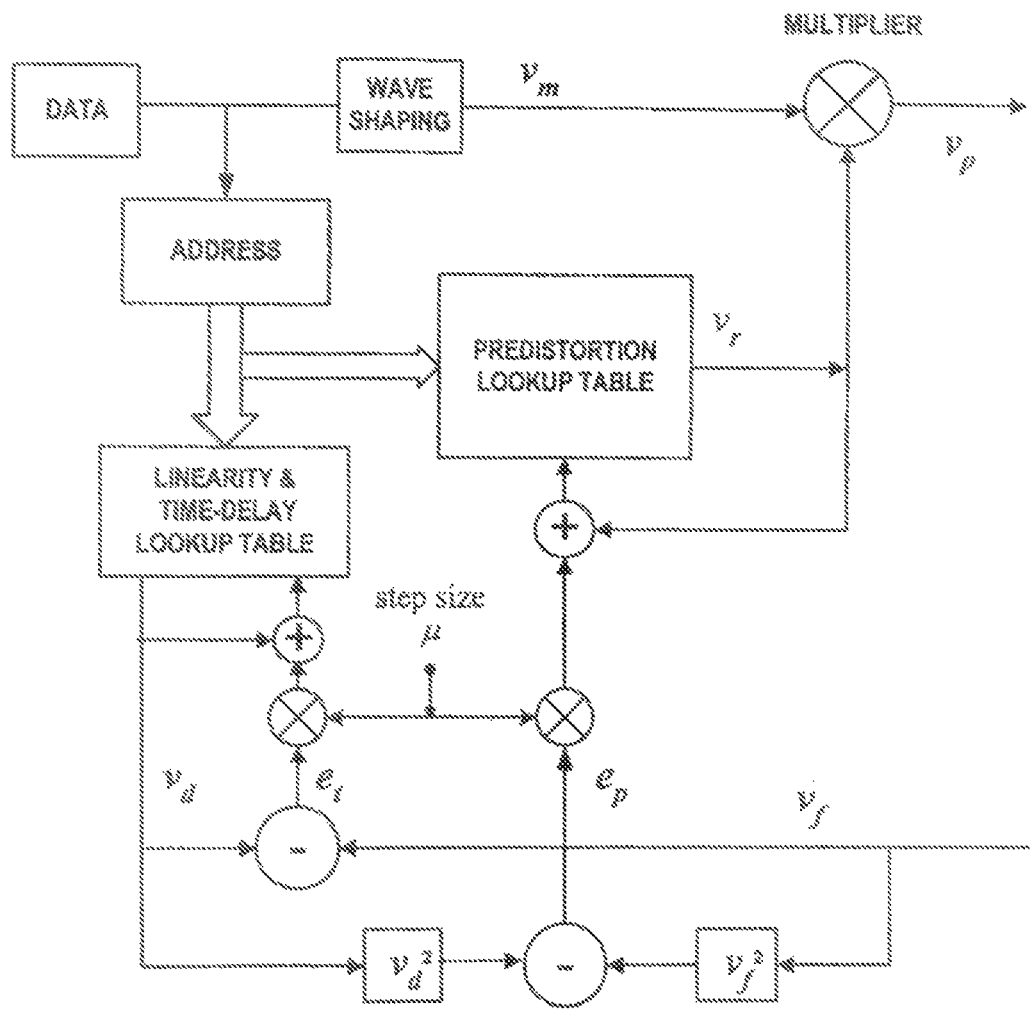
FIG. 5 shows schematically the lookup tables' arrangement in the adaptive digital predistortion scheme.

Handset is trained by two phases. First one is to obtain and store the linearity of PA and time-delay characteristics of channels to the linearity and time-delay tables. Second one is to generate the required predistortion signals and to store them into predistortion lookup tables. The training time for two phases will take about 0.5~1 second. Preferably, the training time for two phases is less than about 4 seconds. When all adaptive training finished, the handset predistortion can be implemented by the organization shown as FIG. 4. This is a very simple structure and may use the existing DSP room in handset for programming without adding any extra hardware circuit, and therefore is a cost-saving and high efficiency approach.

Predistortion Lookup Tables

The predistortion lookup tables for I- and Q-channel store the non-linearity of PA in inverse to AM-AM and AM-PM distortion to correct nonlinear distortion of RF transmitter. The predistortion lookup tables can be configured in a number of ways. However, a drawback of lookup table structure in traditional predistorter is memory less system, slow tracking speed and complicity structure, and therefore is unable to be used in handsets.

The new memorized predistorter structure presented in this patent introduces memory function into predistortion scheme by addressing operation. When the training procedure completed, the predistortion lookup tables just need to read out the signal stored in table entries according to the corresponding address for distortion correction. Thus, the predistortion of handset is completed by a simple and fast approach without great amount calculating for each correcting sampler so as to reduce of power consumption of handset.

The lookup tables of predistorter are based on a stored compensation principle that maps a set of input data into a digital output, and are updated adaptively by a time delay algorithm. The output signal of lookup table is actually related to the previous N transmitted data, and therefore has a memory function when compensate the nonlinearity of PA.

Linearity and Time-Delay Tables

The linearity and time-delay tables for I- and Q-channel are used to store the linearity of PA and time-delay characteristics of channel by adaptive training processing. In order to obtain linearity of PA, two larger sizes of lookup tables should be designed for I- and Q-channel, respectively, to obtain the linear reference signal with time-delay. The tables' outputs are compared with the feedback signals to result in the weighted error signals with nonlinear distortion for predistortion tables updating by a adaptive algorithm. After the training procedure finishes, the linearity and time-delay tables accomplish their mission.

Address of Lookup Table

The address of lookup table in predistorter is formed by the following approach. At first, the signal complex envelope of PA output can be expressed as $$v_a = v_Q G(|v_Q|^2) = H(v_p) G(|H(v_p)|^2) \quad (1)$$

where $V_Q$, is the output of quadrature modulator, $v_p$ is the predistorted signal, H is an assumed transform function from DAC to quadrature modulator, and G is a level-dependent complex gain of power amplifier. We see from predistorter architecture of FIG. 3 that the complex gain predistorter is described by the following complex gain equation $$v_p = v_m F(V_m) = v_m v_p \quad (2)$$

where F is the mapping function of lookup table, which maps a N-dimensional vector $V_m$ to real output. In fact, the N-dimensional vector represents a set of N-bit address of lookup table, expressed by $$V_m = (sg_1, sg_2, \ldots, sg_N)^T \quad (3)$$

where each binary symbol $sg_i$ in above vector can be obtained by the following expression $$sg_i == \begin{cases} 1 & v_m = 1, 1 \le i \le N \\ 0 & v_m = -1, 1 \le i \le N \end{cases} \quad (4)$$

which transforms the data from coder to the binary sign with the form of 0 or 1.

Based on mobile system architecture, the two predistortion tables are used for I and Q-channel, respectively, to map any possible combinations of input binary symbol to the lookup table output, written as $$v_{rI} = F_I(V_{mI}) \; v_{rQ} = F_Q(V_{mQ})$$

where $v_{rI} = Re(v_r)$, $v_{rQ} = Im(v_r)$ and $V_{mI} = Re(V_m)$, $V_{mQ} = Im(V_m)$. $\quad (5)$ Adaptive Methodology for Predistortion Lookup Table The adaptive memorized lookup table consists of address register and memory table. The address of lookup tables are formed in a shift register by first taking binary symbol by means of Eq. (3) and (4) and then sequentially feeding the binary symbol into the shift register. The address determines the corresponding entry of lookup table that stores information related to previous N transmitted data to correct nonlinearity of PA.

Assume that the address of lookup table is formed by N-bits shift register, then the lookup table contains $M=2^N$ entries. Clearly, each output of lookup table is a function of last N transmitted data. Thus, there exist M possible estimates for PA nonlinearity at any compensation instant, and only one of them is selected as the output of lookup table by means of the address formed by N transmitted signal. The output signal is used to compensate and correct nonlinear distortion of PA.

The lookup table structure, based on the memory compensation principle, is involved only very simple logical operation and less complexity hardware structure, therefore, is better suitable to handset and higher bit rate wide band wireless communication system. We denote the address vector of table at the kth time as $$V_m(k) = (sg_1(k), sg_2(k), \ldots, sg_N(k))^T \quad (6)$$

All possible input vectors from k to previous k−M+1 time are expressed by the following set $$A = \{V_m(k), V_m(k-1), \ldots, V_m(k-M+1)\} \quad (7)$$

which records M possible estimates of PA nonlinearity, denoted by $$R(k) = (v_r(k), v_r(k-1), \ldots, v_r(k-M+1))^T \quad (8)$$

At the same time, only one of the estimates is read out from the lookup table $$v_r(k) = r_{q(k)}(k) \; q(k) = V_m(k) \in A \in \{0,1\}^N \quad (9)$$

where the subscript $q(k) = V_m(k)$ denotes the address determined by N input binary symbol characters at kth time. Thus, the mapping function F of lookup table can be written by $$F(V_m(k)) = r_{q(k)}(k) \; V_m(k) \in \{0,1\}^N, r \in R \quad (10)$$

Note that F is unknown and hardly expressed mathematically before adaptive procedure beginning. However, F may be determined adaptively by updating lookup table entries under the adaptive algorithm to realize all possible mapping that corresponds to the relations with $\{0,1\}^N \to R$.

The entries of lookup table can be updated by the following iteration $$r_i(k+1) = \begin{cases} r_i(k) & 1 \le i \le M, i \ne q(k) \\ r_i(k) + \mu e_p(k) & i = q(k) \end{cases} \quad (11)$$

where $e_p(k)$ is the error signal, and $\mu$ is the step size ranged from $0 < \mu < 1$ to control the convergence rate and steady-state of algorithm.

The error signal $e_p(k)$ contains both AM-AM and AM-PM components of PA so that the memorized predistorter could track adaptively variation of amplitude and phase characteristics of PA. The envelope error using to update lookup table entries is given by $$e_p(k) = v_d^2(k) - v_f^2(k) \quad (12)$$

where $v_f^2(k)$ and $v_d^2(k)$ express the envelopes of feedback signal $v_f(k)$ and reference signal $v_d(k)$ respectively.

Adaptive Updating of Linearity and Time-Delay Lookup Table

The adaptive training for linearity and time-delay table is based on the traditional MSE updating algorithm. The entries of lookup table are updated by the following iteration $$r_i(k+1) = \begin{cases} r_i(k) & 1 \le i \le M, i \ne q(k) \\ r_i(k) + \mu e_i(k) & i = q(k) \end{cases} \quad (13)$$

where the error signal $e_i(k)$ is given by $$e_i(k) = v_d(k) - v_f(k) \quad (14)$$

where $v_f(k)$ and $v_d(k)$ express the feedback signal with linear characteristic and reference signal that is the output of table, respectively.

(Other) Observations

Embodiments of the present invention may be adapted for use for all wireless systems regardless the modulation types (such as QAM, QPSK, OFDM and others) and PA models used in wireless systems including variety of mobile stations, handsets, base stations and access points such as, for example:

Current wireless system: CDMA, TDMA, GSM, GPRS and their extension systems;

Next generation broadband wireless system: CDMA2000, UMTS, WCDMA, 3GPP, WLAN (802.11a, b specifications) and their extension systems;

PDA and potable mobile PC for WLAN (802.11a, b) system and their extension systems.

In an embodiment, an arrangement of lookup table address introduces a stored compensation function into predistorter. As the result, the predistorter is of memory function when it estimates and corrects nonlinear distortion of RF transmitter, which is extremely effective to provide a dynamic predistortion correction of AM-AM and AM-PM distortion in wider range.

In an embodiment, an arrangement the stored compensation function depends on the address data in lookup table. Therefore, each predistortion output of lookup table is not only related to the current input data but also related to last N transmitted data. Actually, the output of predistorter is a function of last N transmitted symbol.

In an embodiment, the predistortion correction for AM-AM and AM-PM distortion can be implemented by a measure of vector multiplication between the outputs of lookup tables and the output shaping filters. Also, other approach such as vector adding can be used to implement the predistortion correction. Because all entries of lookup table are adaptively updated by a weighted envelope error that contains both AM-AM and AM-PM characteristics of PA, the outputs of lookup tables contain the inverse AM-AM and AM-PM distortion components.

In an embodiment, the predistorter uses two types of lookup tables for different roles in handset predistortion. One is the predistortion table to provide predistortion signal for the non-linearity correction of PA. Another is the linearity and time-delay table to store the linearity of PA and time-delay characteristics of channel, which will be used as reference signal for the training of predistortion table.

In an embodiment, the linearity of PA and time-delay characteristics of channel are obtained by adaptive training. After the algorithm converges, the memorized information in the table is the reference signal required by predistortion table. Because the reference signal also contains the time-delay characteristics of channel of handset, there is no necessary to build a special time-delay circuit for estimating the time-delay of channel for the power consumption saving in handset.

In an embodiment, the linearity and time-delay table is trained by adaptive algorithm when PA of handset is set in the linear region so that the linear characteristics of PA could be pick up and stored into the entries of table. After algorithm converges, the required linear and time-delay characteristics of handset are stored in the table, and PA is set back to its non-linear operating region working as Class C or D amplifier.

In an embodiment, the linearity and time-delay table will be trained first to obtain the linear and time-delay characteristics of handset. Then predistortion table is trained by the reference signal from linearity and time-delay table to obtain the required predistortion signal and be stored in predistortion table for nonlinear distortion correction.

In an embodiment, the training for both linearity table and the predistortion table will take around 0.5 to 1 second. Afterward, the linearity and time-delay table accomplished its mission and becomes static table without any output and being updated. Also the predistortion table is no longer updated by adaptive algorithm, and only responds to the input data in address register to output the corresponding predistortion signal. Thus, in an embodiment, the lookup tables in the predistorter will not be longer be updated after the training. For example, they will not be updated for at least one telephone call. For example, they will not be updated for at least one day of use. An actual handset predistortion structure is very simple and may use the existing DSP chip in handset for all predistortion signal processing.

Throughout the description and drawings, example embodiments are given with reference to specific configurations. It will be appreciated by those of ordinary skill in the art that the present invention can be embodied in other specific forms. Those of ordinary skill in the art would be able to practice such other embodiments without undue experimentation. The scope of the present invention, for the purpose of the present patent document, is not limited merely to the specific example embodiments of the foregoing description, but rather is indicated by the appended claims. All changes that come within the meaning and range of equivalents within the claims are intended to be considered as being embraced within the spirit and scope of the claims.

What is claimed is:

1. A method of operating a power amplifier, the method comprising:

initializing the power amplifier;

establishing pre-computed distortion contributions by training based on pre-compensation training feedback signals representative of output of the power amplifier;

storing the pre-computed distortion contributions in a lookup table;

maintaining the lookup table;

accepting an original value that reflects information to be communicated;

generating a digital lookup-table key based on the original value;

retrieving from the lookup table, using the digital lookup-table key, a corresponding pre-computed distortion contribution for the original value;

distorting the original value based on the corresponding pre-computed distortion contribution to obtain a distorted value to pre-compensate for the nonlinear characteristics of the power amplifier; and wirelessly transmitting a pre-distorted signal based on the distorted value;

wherein establishing pre-computed distortion contributions comprises:
establishing reference information by training based on reference training feedback signals via feedback channels, the reference training feedback signals being representative of the output of the power amplifier; and
storing the reference information in a reference table; and
wherein maintaining the lookup table comprises refraining, once the pre-computed distortion contributions are established, for at least one entire telephone conversation, from further training to establish the pre-computed distortion contributions or the reference information.

2. The method of claim 1 wherein the reference information comprises linearity characteristics of the power amplifier and time-delay parameters of the feedback channels.

3. The method of claim 1 wherein establishing each respective pre-computed distortion contribution comprises:
squaring an in-phase component of a respective pre-compensation training feedback signal to produce a squared in-phase output value;
squaring a quadrature component of the respective pre-compensation training feedback signal to produce a squared quadrature output value;
squaring an in-phase component of a corresponding reference signal according to the reference information to produce a squared in-phase reference value;
squaring a quadrature component of the corresponding reference signal according to the reference information to produce a squared quadrature reference value;
determining an in-phase difference between the squared in-phase reference value and the squared in-phase output value;
determining a quadrature difference between the squared quadrature reference value and the squared quadrature output value; and
determining the respective pre-computed distortion contribution based on the in-phase difference and the quadrature difference.

4. The method of claim 3 wherein the reference information and the pre-computed distortion contributions are established within four seconds.

5. A method of operating a power amplifier, the method comprising:
initializing the power amplifier;
establishing pre-computed distortion contributions by training based on pre-compensation training feedback signals representative of output of the power amplifier;
storing the pre-computed distortion contributions in a lookup table;
maintaining the lookup table;
accepting an original value that reflects information to be communicated;
generating a digital lookup-table key based on the original value;
retrieving from the lookup table, using the digital lookup-table key, a corresponding pre-computed distortion contribution for the original value;
distorting the original value based on the corresponding pre-computed distortion contribution to obtain a distorted value to pre-compensate for the nonlinear characteristics of the power amplifier; and
wirelessly transmitting a pre-distorted signal based on the distorted value;
wherein establishing pre-computed distortion contributions comprises:
establishing reference information by training based on reference training feedback signals via feedback channels, the reference training feedback signals being representative of the output of the power amplifier; and
storing the reference information in a reference table; and
wherein maintaining the lookup table comprises refraining, once the pre-computed distortions contributions are established, for at least one day, from further training to establish the pre-computed distortion contributions or the reference information.

6. The method of claim 1 wherein the reference information and the pre-computed distortion contributions are obtained through adaptive iteration.

7. The method of claim 1 wherein the power amplifier is a component of a mobile device.

8. A method of operating a power amplifier for wireless transmission of signals, the method comprising:
maintaining a lookup table that contains pre-computed distortion contributions;
accepting an original value that reflects information to be communicated;
generating a digital lookup-table key based on the original value;
retrieving from the lookup table, using the digital lookup-table key, a corresponding pre-computed distortion contribution for the original value;
distorting the original value based on the corresponding pre-computed distortion contribution to obtain a distorted value to pre-compensate for the nonlinear characteristics of the power amplifier; and
wirelessly transmitting a pre-distorted signal based on the distorted value;
wherein maintaining the lookup table comprises:
establishing pre-computed distortion contributions by training based on pre-compensation training feedback signals, the pre-compensation feedback signals being representative of output of the power amplifier;
storing the pre-computed distortion contributions in a lookup table; and
refraining, once the pre-computed distortion contributions are established, for at least one entire communication session, from further training to establish the pre-computed distortion contributions or the reference information; and
wherein establishing pre-computed distortion contributions comprises:
establishing reference information by training based on reference training feedback signals via feedback channels, the reference training feedback signals being representative of the output of the power amplifier; and
storing the reference information in a reference table.

9. The method of claim 8 wherein the reference information comprises linearity characteristics of the power amplifier and time-delay parameters of the feedback channels.

10. The method of claim 8 wherein the reference information and the pre-computed distortion contributions are obtained through adaptive iteration.

11. The method of claim 8 wherein establishing each respective pre-computed distortion contribution comprises:
squaring an in-phase component of a respective pre-compensation training feedback signal to produce a squared in-phase output value;

squaring a quadrature component of the respective pre-compensation training feedback signal to produce a squared quadrature output value;

squaring an in-phase component of a corresponding reference signal according to the reference information to produce a squared in-phase reference value;

squaring a quadrature component of the corresponding reference signal according to the reference information to produce a squared quadrature reference value;

determining an in-phase difference between the squared in-phase reference value and the squared in-phase output value;

determining a quadrature difference between the squared quadrature reference value and the squared quadrature output value; and determining the respective pre-computed distortion contribution based on the in-phase difference and the quadrature difference.

12. The method of claim 11 wherein the reference information and the pre-computed distortion contributions are established within four seconds.

13. The method of claim 8 wherein the power amplifier is a component of a mobile device.

14. A method of operating a power amplifier for wireless transmission of signals, the method comprising:

maintaining a lookup table that contains pre-computed distortion contributions;

accepting an original value that reflects information to be communicated;

generating a digital lookup-table key based on the original value;

retrieving from the lookup table, using the digital lookup-table key, a corresponding pre-computed distortion contribution for the original value;

distorting the original value based on the corresponding pre-computed distortion contribution to obtain a distorted value to pre-compensate for the nonlinear characteristics of the power amplifier; and wirelessly transmitting a pre-distorted signal based on the distorted value;

wherein maintaining the lookup table comprises:

establishing pre-computed distortion contributions by training based on pre-compensation training feedback signals, the pre-compensation feedback signals being representative of output of the power amplifier;

storing the pre-computed distortion contributions in a lookup table; and refraining, once the pre-computed distortion contributions are established, for at least one day, from further training to establish the pre-computed distortion contributions or the reference information; and wherein establishing pre-computed distortion contributions comprises:

establishing reference information by training based on reference training feedback signals via feedback channels, the reference training feedback signals being representative of the output of the power amplifier; and storing the reference information in a reference table.

* * * * *